United States Patent [19]
Nagai et al.

[11] Patent Number: 6,043,572
[45] Date of Patent: Mar. 28, 2000

[54] LINEAR MOTOR, STAGE DEVICE, AND EXPOSING DEVICE

[75] Inventors: Shingo Nagai, Kawasaki; Toyoshige Sasaki; Shigeto Kamata, both of Yokohama, all of Japan

[73] Assignee: Canon Kabushiki Kaisha, Tokyo, Japan

[21] Appl. No.: 09/172,163

[22] Filed: Oct. 14, 1998

[30] Foreign Application Priority Data

Oct. 20, 1997 [JP] Japan ..................................... 9-303330

[51] Int. Cl.[7] .................................................. H02K 41/00
[52] U.S. Cl. ............................................................ 310/12
[58] Field of Search ................................. 310/12, 13, 14; 318/135

[56] References Cited

U.S. PATENT DOCUMENTS

| | | | |
|---|---|---|---|
| 4,859,974 | 8/1989 | Kliman et al. | 335/229 |
| 4,912,746 | 3/1990 | Oishi | 310/12 |
| 5,032,746 | 7/1991 | Ueda et al. | 310/12 |
| 5,723,929 | 3/1998 | Niimi | 310/154 |

*Primary Examiner*—Nestor Ramirez
*Assistant Examiner*—Judson H. Jones
*Attorney, Agent, or Firm*—Fitzpatrick, Cella, Harper & Scinto

[57] ABSTRACT

A linear motor includes a coil for receiving an electrical current and a first plurality of permanent magnets. The coil and the first plurality of permanent magnets move relative to each other in a direction of relative movement when an electrical current flows through the coil. The permanent magnets are arrayed in the direction of relative movement to form a first array. The direction of polarity of each permanent magnet in the first plurality of permanent magnets is oriented 90° relative to the direction of polarity of an adjacent permanent magnet in the first plurality of permanent magnets. The first plurality of permanent magnets has a main portion and an end portion comprising plural corrective permanent magnets. Each of the plural corrective permanent magnets is smaller than the permanent magnets in the main portion having the same or opposite direction of polarity.

10 Claims, 8 Drawing Sheets

FIG. 1
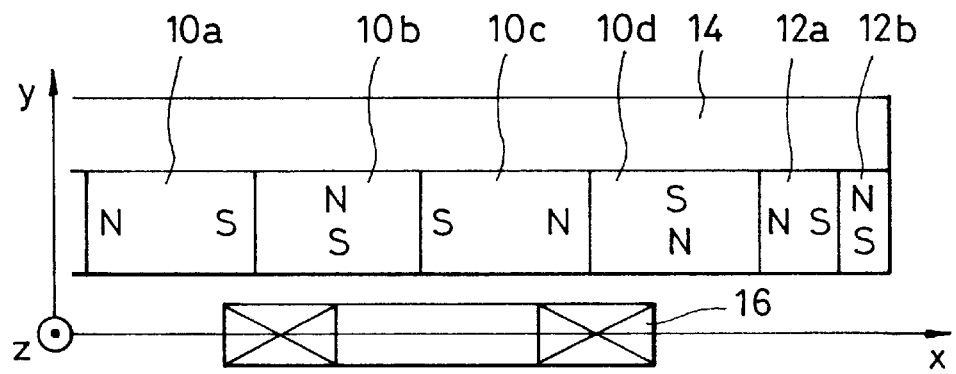
FIG. 2
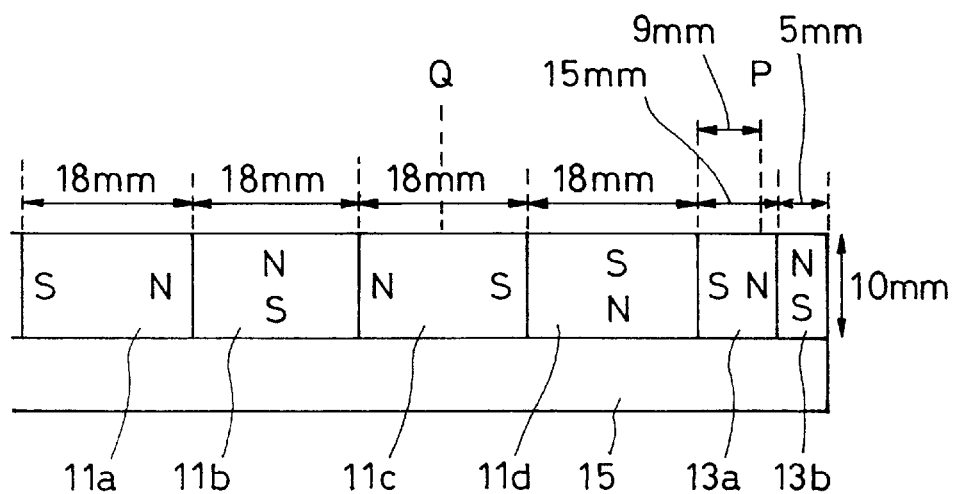
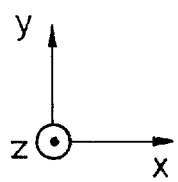

MANUFACTURING FLOW FOR SEMICONDUCTOR DEVICE

WAFER PROCESS

6,043,572

LINEAR MOTOR, STAGE DEVICE, AND EXPOSING DEVICE

BACKGROUND OF THE INVENTION

1. Field of the Invention

The present invention relates to a linear motor, a stage device, and an exposing device employed as a driving mechanism for super-precise equipment, such as semiconductor manufacturing apparatuses, measurement devices, and so forth.

2. Description of the Related Art

FIG. 9 shows the array of permanent magnets used in a known linear motor. This figure shows only one side of the permanent magnet group (stator group), wherein 70 denotes a yoke and 71 (71a through 71c) denotes permanent magnets arrayed on the yoke, each of the permanent magnets 71 being of a rectangular parallelepiped with the corners thereof having been removed. Also, the plurality of permanent magnets 71 are arrayed such that the polarity (N-pole and S-pole) thereof alternates, and the thickness and width of each of the permanent magnets are determined so as to generate a sine waveform magnetic field in the space between the stator group and an opposing stator group.

However, with the above known example, the thickness and width of each of the permanent magnets has to be changed according to the position thereof in order to generate a sine waveform magnetic field, and further, the form thereof is not a simple rectangular parallelepiped. Thus there is a problem that it is difficult and costly to manufacture the permanent magnets with high precision. Also, there is a problem that the driving force of the linear motor decreases, since the magnetic flux density is lower than that of a rectangular parallelepiped.

SUMMARY OF THE INVENTION

The present invention has been made in the light of such problems, and accordingly, it is an object of the present invention to provide an excellent linear motor which is inexpensive, has a high driving force, and little thrust rippling (irregularities in thrust).

It is another object of the present invention to cause the magnetic field to closely approximate a sine waveform even at the area near the end portion of the permanent magnets forming the linear motor, thereby effectively using space, and reducing the volume of the movable portion.

According to one aspect, the present invention which achieves these objectives relates to a linear motor comprising a coil for receiving an electrical current and a first plurality of permanent magnets. The coil and the first plurality of permanent magnets move relative to each other in a direction of relative movement when an electrical current flows through the coil. The permanent magnets are arrayed in the direction of relative movement to form a first array. The direction of polarity of each permanent magnet in the first plurality of permanent magnets is oriented 90° relative to the direction of polarity of an adjacent permanent magnet in the first plurality of permanent magnets. The first plurality of permanent magnets has a main portion and an end portion comprising plural corrective permanent magnets. Each of the plural corrective permanent magnets is smaller than any one of the permanent magnets in the main portion having the same or opposite direction of polarity.

In one embodiment, the number of the plural corrective permanent magnets is two. In addition, the plural corrective permanent magnets comprise an end corrective permanent magnet positioned at the end of the end portion of the first plurality of permanent magnets whose dimension in the direction of relative movement is denoted by $L_{ec}$, and a center side corrective permanent magnet positioned adjacent to the end corrective permanent magnet, being closer to the center of the first plurality of permanent magnets than the end corrective permanent magnet and whose dimension in the direction of relative movement is denoted by $L_{cc}$. In this embodiment, the main portion of the first plurality of permanent magnets comprises first and second main permanent magnets. The first main permanent magnet has the same polarity direction as the end corrective permanent magnet and its dimension in the direction of relative movement is denoted by $L_{main\text{-}same\text{-}polarity\text{-}as\text{-}ec}$. The second main permanent magnet has the same polarity direction as the center side corrective permanent magnet and its dimension in the direction of relative movement is denoted by $L_{main\text{-}same\text{-}polarity\text{-}as\text{-}cc}$. In this embodiment, the motor satisfies the following inequalities:

$$L_{main\text{-}same\text{-}polarity\text{-}as\text{-}cc}/2 < L_{cc} < L_{main\text{-}same\text{-}polarity\text{-}as\text{-}cc};$$

$$L_{ec} < (L_{cc} - L_{main\text{-}same\text{-}polarity\text{-}as\text{-}cc}/2) \times L_{main\text{-}same\text{-}polarity\text{-}as\text{-}ec}/(L_{main\text{-}same\text{-}polarity\text{-}as\text{-}cc}/2)$$

The direction of polarity of the end corrective permanent magnet is perpendicular to the direction of relative movement, and the direction of polarity of the center side corrective permanent magnet is parallel to the direction of relative movement. In addition, the motor further comprises a second plurality of permanent magnets arrayed in the direction of relative movement to form a second array. Each permanent magnet in the first array is opposed to a corresponding permanent magnet in the second array. Corresponding, opposed permanent magnets in the first and second arrays have parallel directions of polarity. In addition the polarity direction changes by ninety degrees in a first rotation direction from one magnet to an adjacent magnet in the first array and the polarity direction changes by ninety degrees in a second rotation direction, opposite from the first rotation direction, from one magnet to an adjacent magnet in the second array.

The first and second arrays each comprise parallel permanent magnets whose polarity direction is parallel to the direction of relative movement and perpendicular permanent magnets whose polarity direction is perpendicular to the direction of relative movement. The polarity direction of the parallel permanent magnets in the first array is in the opposite direction from opposed, corresponding parallel permanent magnets in the second array. The polarity direction of the perpendicular permanent magnets in the first array is in the same direction from opposed, corresponding parallel permanent magnets in the second array.

In one embodiment, the permanent magnets comprise a movable portion of the motor and the coil comprises a stator of the motor. In addition, the first plurality of permanent magnets can comprise a parallel main portion permanent magnet in the main portion whose polarity direction is parallel to the direction of relative movement and a parallel end portion permanent magnet in the end portion whose polarity is parallel to the direction of relative movement. The right end of the coil, when the coil and the first plurality of permanent magnets move relative to each other to a maximum extent, is positioned, in the direction of relative movement, one-half the length of the parallel main portion permanent magnet from the end of the parallel end portion permanent magnet facing the main portion toward the right end of the end portion.

According to another aspect, the present invention which achieves these objectives, relates to a stage device comprising a stage and a linear motor for moving the stage. The motor comprises a coil for receiving an electrical current and a plurality of permanent magnets. The coil and the plurality of permanent magnets move relative to each other in a direction of relative movement when an electrical current flows through the coil. The permanent magnets are arrayed in the direction of relative movement to form an array. The direction of polarity of each permanent magnet in the plurality of permanent magnets is oriented 90° relative to the direction of polarity of an adjacent permanent magnet in the plurality of permanent magnets. The plurality of permanent magnets has a main portion and an end portion comprising plural corrective permanent magnets. Each of the plural permanent magnets is smaller than any one of the permanent magnets in the main portion having the same or opposite direction of polarity.

According to another aspect, the present invention which achieves these objectives, relates to an exposing device for transferring a pattern formed on a reticle onto a wafer. The device comprises a stage for loading a wafer or reticle having a pattern formed thereon, a linear motor for moving the stage, and means for transferring the pattern formed on the reticle onto the wafer. The motor comprises a coil for receiving an electrical current and a plurality of permanent magnets. The coil and the plurality of permanent magnets move relative to each other in a direction of relative movement when an electrical current flows through the coil. The permanent magnets are arrayed in the direction of relative movement to form an array. The direction of polarity of each permanent magnet in the plurality of permanent magnets is oriented 90° relative to the direction of polarity of an adjacent permanent magnet in the first plurality of permanent magnets. The plurality of permanent magnets has a main portion and an end portion comprising plural corrective permanent magnets. Each of the plural corrective permanent magnets is smaller than any one of the permanent magnets in the main portion having the same or opposite direction of polarity.

Other features and advantages of the present dinvention will be apparent from the following description taken in conjunction with the accompanying drawings, in which like reference characters designate the same or similar parts through the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a schematic diagram of the linear motor according to the present invention;

FIG. 2 is a diagram illustrating a specific design example of the linear motor according to the present invention;

DESCRIPTION OF THE PREFERRED EMBODIMENT

Figure 3:
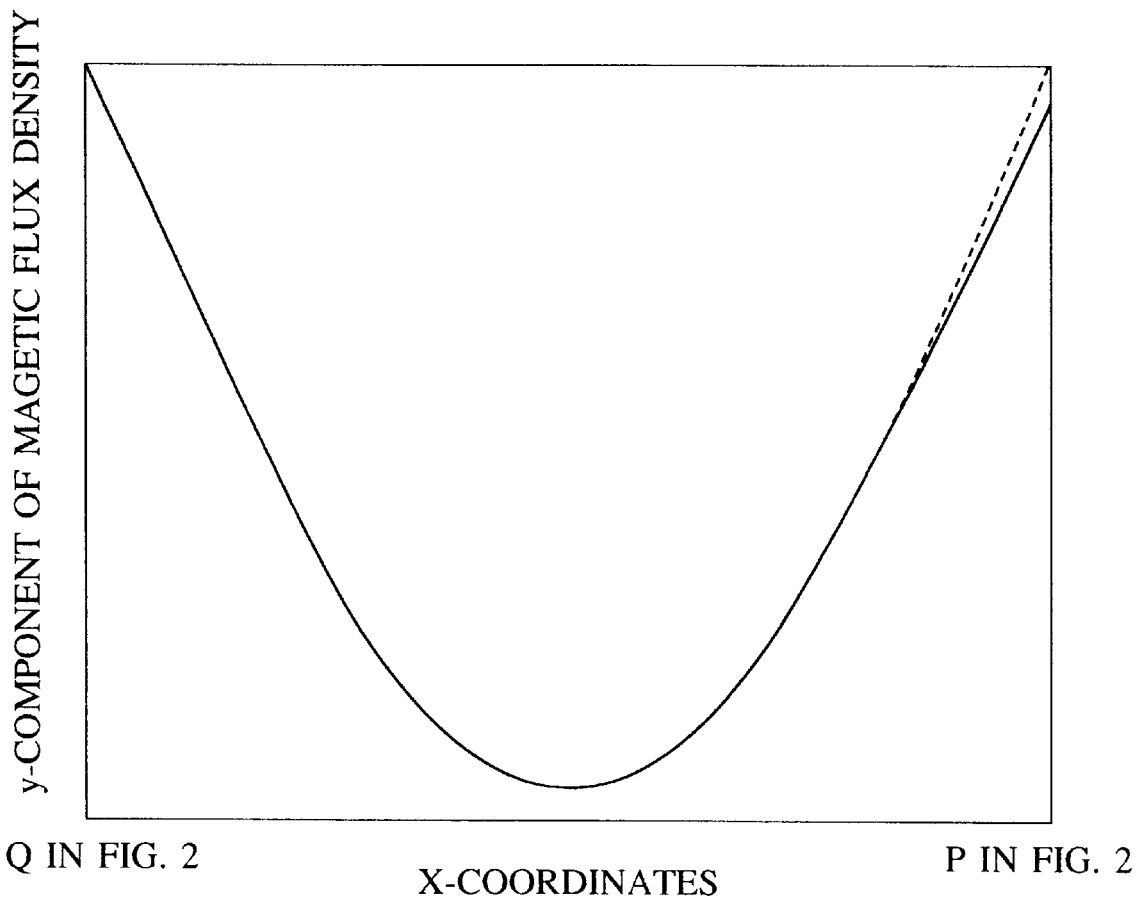
FIG. 3 is a graph of the y-direction component of the magnetic flux density distribution generated by the permanent magnets shown in FIG. 2.

Preferred embodiments of the present invention will now be described in detail in accordance with the accompanying drawings.

FIG. 1 is a diagram best describing the characteristics of the linear motor according to the present invention, illustrating the end portion of the linear motor.

FIG. 1 shows two permanent magnet arrays of permanent magnets arrayed in the x-direction, which is the direction of relative movement of the permanent magnets and coils 16. The upper array comprises a main portion including permanent magnets 10a–10d and an end portion comprising an end corrective permanent magnet 12b and a center side corrective permanent magnet 12a, closer to the center of the main portion than the end corrective permanent magnet. Similarly, the lower array comprises a main portion including permanent magnets 11a–11d and an end portion comprising an end corrective permanent magnet 13b and a center side corrective permanent magnet 13a, closer to the center of the main portion than the end corrective permanent magnet. The direction of polarity of each magnet in each array differs by 90° from the polarity direction of an adjascent magnet in the same array. More specifically, in the upper array, the polarity direction changes by 90° in the clockwise direction from one magnet to an adjacent magnet to the right thereof, while in the lower array, the polarity direction changes by 90° in the counter-clockwise direction from one magnet to an adjacent magnet to the right thereof. It is also within the scope of the present invention for the polarity orientation to change by 90° in the counter-clockwise direction from one magnet to an adjacent magnet to the right thereof for the upper array and to change by 90° in the clockwise direction from one magnet to an adjacent magnet to the right thereof for the lower array. Also, as can be understood from FIG. 1, permanent magnets 10a, 10c, 11a, and 11c whose direction of polarity is parallel to the x-direction, are positioned so that the direction of polarity of magnets 10a and 10c is opposite to the direction of polarity of magnets 11a and 11c. Also, permanent magnets 10b, 10d, 11b and 11d are positioned so that the direction of polarity of magnets 10b and 11b is the same and the direction of polarity of magnets 10d and 11d is the same.

Also, the four permanent magnets whose direction of polarity faces the x-direction are of the same dimensions, and the four permanent magnets whose direction of polarity faces the y-direction are of the same dimensions.

Reference numerals 12a, 12b, 13a and 13b are permanent magnets for correcting the magnetic field in order to cause the magnetic field distribution to assume a sine-waveform, and are positioned at the end portion of the permanent magnets 10a through 10d and 11a through 11d. Also, the direction of polarity of the permanent magnets 12a, 12b, 13a and 13b follows the same rule governing the permanent magnets 10a through 10d and 11a through 11d. Also, the size and volume of the corrective magnets 12a and 13a are smaller than the size and volume of the permanent magnets 10a and 10c, and 11a and 11c, respectively, which have their polarity pointing in the same direction, and the size and volume of the corrective magnets 12b and 13b, whose direction of polarity is in the y-direction, are smaller than the volume and size of the permanent magnets 10b and 10d, and 11b and 11d, respectively, which have their polarity pointing in the same direction.

Reference numerals 14 and 15 are yokes, and the permanent magnets 10a through 10d and corrective magnets 12a and 12b are positioned on yoke 14, and the permanent magnets 11a through 11d and corrective magnets 13a and 13b are positioned on yoke 15. Yoke 14 and yoke 15 are fixed so as to not move relative one to another. Reference numeral 16 denotes a plurality of electromagnetic coils positioned in the direction of movement, and the permanent magnets and coils commence relative movement by means of providing electric current to the electromagnetic coils. Incidentally, in the event that the permanent magnets are to serve as the movable portion, the electric coils serve as the stator, and conversely, in the event that the electric coils are to serve as the movable portion, the permanent magnets can serve as the stator.

By means of arraying such magnets, a fixed magnetic field is generated between the opposing permanent magnets 10a through 10d and 11a through 11d, and the corrective magnets 12a and 12b and 13a and 13b.

Particularly, the y-component of the magnetic field along the x-axial direction existing in the space between the permanent magnet arrays can be caused to approximate a sine-waveform at all points along the x-direction between the arrays including the end portion of the arrays, by providing the permanent magnets with such corrective magnets as described above.

Now, as shown in this figure, it is preferable that the number of permanent magnets provided at the end portion be two. Further, as shown in the following Expression 1, of these two permanent magnets, the dimension ($L_{13a}$) of the permanent magnet 13a in the direction of relative movement of the array including permanent magnet 13a and the coils 16 (in the x-direction in this embodiment) is greater than half of the same dimension ($L_{11a}$) of the permanent magnet 11a having the same direction of polarity as the permanent magnet 13a and is smaller than the same dimension ($L_{11a}$) of the permanent magnet 11a.

Expression 1

$$L_{11a}/2 < L_{13a} < L_{11a}$$

More generally, the dimension of the center side corrective permanent magnet in an array in the direction of relative movement of the array with respect to the coils is greater than half the same dimension of a permanent magnet in the main portion of the same array having the same direction of polarity and is smaller than the same dimension of than permanent magnet. In other words, $$L_{main\text{-}same\text{-}polarity\text{-}as\text{-}cc}/2 < L_{cc} < L_{main\text{-}same\text{-}polarity\text{-}as\text{-}cc},$$

where $L_{cc}$ denotes the dimension in the relative-movement direction of a center side corrective permanent magnet positioned adjacent to the end corrective permanent magnet, being closer to the center of the main portion of the array than the end corrective permanent magnet, and where $L_{main\text{-}same\text{-}polarity\text{-}as\text{-}cc}$ denotes the dimension in the relative-movement direction of a permanent magnet in the array in the main portion having the same polarity direction as the center side corrective permanent magnet.

Also, as shown in the following Expression 2, it is preferable that the dimension ($L_{13b}$) of the permanent magnet (13b), positioned at the end portion of the array of the linear motor, in the direction of a relative movement of the array with respect to the coils is smaller than a value obtained by subtracting half of the dimension ($L_{11a}$) in the relative-movement direction, of a permanent magnet in the main portion of the same array having the same polarity direction as the center side corrective permanent magnet 13a from the dimension ($L_{13a}$) of the center side corrective permanent magnet in the relative-movement direction and multiplying this difference by the dimension ($L_{11b}$) of the permanent magnet (11b) in the main portion having the same direction of polarity as the end corrective permanent magnet (13b) in the relative-movement direction divided by half of the dimension ($L_{11a}$) of the permanent magnet (11a) having the same polarity direction as the center side corrective permanent magnet (13a) in the direction of relative movement of the array with respect to the coils.

Expression 2

$$L_{13b} < (L_{13a} - L_{11a}/2) \times \frac{L_{11b}}{L_{11a}/2}$$

More generally, $$L_{ec} < (L_{cc} - L_{main\text{-}same\text{-}polarity\text{-}as\text{-}cc}/2) \times L_{main\text{-}same\text{-}polarity\text{-}as\text{-}ec}/(L_{main\text{-}same\text{-}polarity\text{-}as\text{-}cc}/2),$$

where the dimension in the direction of relative movement of an end corrective permanent magnet positioned at the end of the end portion of one of the arrays is denoted by $L_{ec}$, the dimension in the direction of relative movement of a center side corrective permanent magnet positioned adjacent to the end corrective permanent magnet, being closer to the center of the main portion of the array than the end corrective permanent magnet is denoted by $L_{cc}$, the dimensions in the relative-movement direction of a main permanent magnet having the same polarity direction as the end corrective permanent magnet is denoted by $L_{main\text{-}same\text{-}polarity\text{-}as\text{-}ec}$, and the dimension in the relative movement direction of a main permanent magnet having the same polarity direction as the center side corrective permanent magnet is denoted by $L_{main\text{-}same\text{-}polarity\text{-}as\text{-}cc}$.

Thus, in the event that the number of permanent corrective magnets at the end portion of the array is two, it is preferable that the direction of polarity of the corrective permanent magnet 13a at the center side of the end portion be parallel to the direction of relative movement of the array and the coils and that the direction of polarity of the corrective permanent magnet 13b at the end of the end portion be perpendicular to the direction of relative movement of the array and the coils. Also, as described later, in this case, the arrangement is advantageous for the permanent magnets to serve as the movable portion and the coils to serve as the stator, and generally, the right end of the coils, when the magnets move to their maximum extent to the left, is positioned, in the x-direction, ½ of the length of a magnet in the main portion whose polarity direction is in the direction of relative movement of the coils and the array (e.g. magnet 11a) from the left end (i.e., the center side) of the center side corrective magnet whose polarity direction is in the direction of relative movement of the coils and the array (e.g. magnet 13a) toward the right of the end portion.

First Embodiment

FIG. 2 illustrates a specific array design of the permanent magnets according to the present invention. Here, the permanent magnets serve as the movable portion, and the coils serve as the stator.

In FIG. 2, the length in the direction of relative movement between the coils and permanent magnets (in this case the x-direction) is set such that the permanent magnets 11a and 11c, which have a direction of magnet polarity in the x-direction, each have an x-direction length (in the direction of relative movement) of 18 mm and the permanent magnets 11b and 11d, which have a direction of magnet polarity in the y-direction, each have an x-direction length (in the direction of relative movement) of 18 mm. Also, regarding the permanent magnets for correction, the x-direction length of the corrective magnet 13a with magnet polarity in the x-direction is 15 mm, and the x-direction length of the corrective magnet 13b with magnet polarity in the y-direction is 5 mm. Further, The thickness (y-direction) of the permanent magnet array is 10 mm, and the width (z-direction) is 80 mm. Corresponding magnets in the array on yoke 14 have the same dimensions.

With the movable portion of a linear motor thus constructed of two such arrays, the y-component of an ideal magnetic field existing in the space between the two permanent magnet arrays is a sine-waveform. In this motor when the magnetic arrays attached to the yokes 14 and 15 move to their left to their maximum extent, the right end of coils 16 is directly above point P (position 9 mm outwards from the right end of permanent magnet 11d toward the right end of the end portion). Accordingly, in order to reduce thrust rippling, the y-component of the magnetic field existing in the space between permanent magnets must approximate a sine-waveform in the x-axial direction, at least within the area inwards from P in the figure.

At the end portion of the linear motor shown in FIG. 2 between the opposing permanent magnet arrays, the waveform for ½ period (between Q and P in FIG. 2) of the y-direction component of the magnetic field is shown in FIG. 3. The broken line is the ideal sine-waveform and the solid line is the magnetic flux density waveform produced by the present embodiment, and both practically agree. Particularly, at the end portion, the margin of error, i.e., to extent to which the actual waveform differs from the ideal sine-waveform can be kept within 1% of the amplitude of the sine-waveform, which is extremely small.

Figure 4:
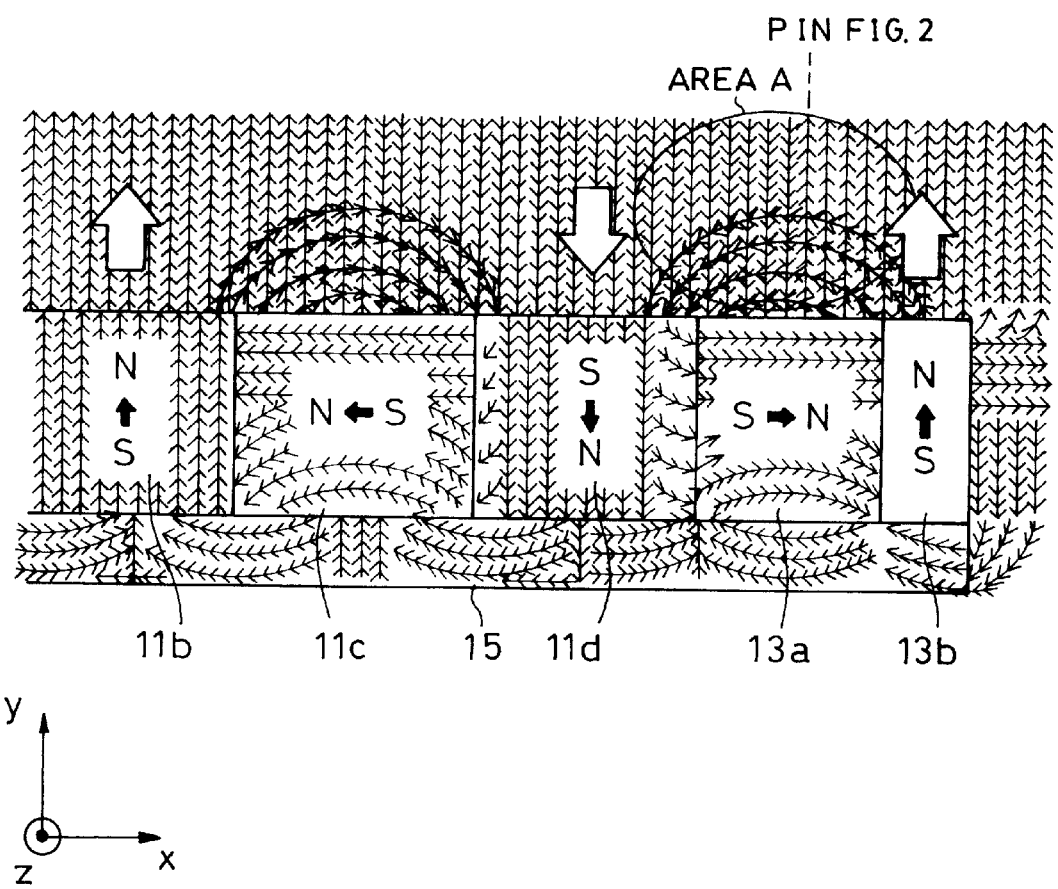
FIG. 4 is an arrow diagram of the space magnetic flux density distribution generated by the permanent magnets shown in FIG. 2.

In this linear motor, the magnetic flux density distribution at the space at the end portion is shown in FIG. 4 as an arrow diagram. The magnetic flux density distribution at the end portion (area A) can be made to approximate the magnetic flux density distribution at the center portion, and consequently, the y-directional component of the magnetic field at the end portion can be brought close to the sine-waveform.

As described in the present embodiment, the magnetic field created between the permanent magnet arrays exhibits alternating clockwise magnetic flux flow and counter-clockwise magnetic flux flow, in the x-direction, by positioning the permanent magnets such that the direction of polarity of adjacent magnets in each array differs by 90°. For example, in FIG. 4, a clockwise magnetic path is formed by means of the permanent magnets 11b through 11d and three unshown magnets opposing these magnets 11b through 11d in the y-direction (permanent magnets 10b through 10d in FIG. 1). In this figure, the direction of a typical magnetic flux is shown by the white arrows.

Now, the y-component of the magnetic flux near the end portion of the permanent magnets can also be be made to approximate the sine-waveform, by providing corrective magnets so as to create a magnetic flux flow the same as that at other portions of the linear motor. According to the present embodiment, a magnetic flux flow near and at the end portion of the motor having a distribution generally the same as that at other portions is created by means of attaching two corrective magnets with a magnetic polarity differing by 90°, according to the same rules as the other magnets.

In FIG. 4, counter-clockwise magnetic flux flow near and at the end portion of the motor practically the same as the magnetic flux flow formed at the center portion of the arrays can be realized by providing the set of the corrective magnet 13a whose magnetic polarity faces the x-direction, and the corrective magnet 13b whose magnetic polarity faces the y-direction. In the event that the corrective magnet 13a alone is provided, so that there is no corrective magnet 13b whose direction of polarity points in the y-direction, there is great magnetic field leakage in the x-direction at the end portion of the corrective magnet 13a, and the distribution is shifted away from an ideal magnetic flux. Accordingly, it is important to provide both a corrective magnet whose direction of polarity points in the x-direction, and a corrective magnet whose direction of polarity points in the y-direction.

Incidentally, in order to thus efficiently control the magnetic flux flow and create a magnetic flux flow at the end portion that is the same as that at the center portion, it is preferable that the number of corrective magnets be two or more. Particularly, in the event that the permanent magnets serve as the movable portion, it is preferable that the number of corrective magnets be two, from a design perspective of reducing the weight of the the movable portion to allow maximum driving of the linear motor.

Now, in the event that the x-directional length of the corrective permanent magnet provided at the end portion for correcting the magnetic field is changed thrust rippling of the motor changes. The difference between the maximum value and minimum value of thrust that the movable portion receives is defined as Fluctuation, and the value thereof is shown in a contour map in FIG. 5. The dimensions of the linear motor used as the same as those shown in FIG. 2, except for the corrective magnets; the length of the corrective magnet 13a in the x-direction being α, and the length of the corrective magnet 13b in the x-direction being β.

Figure 5:
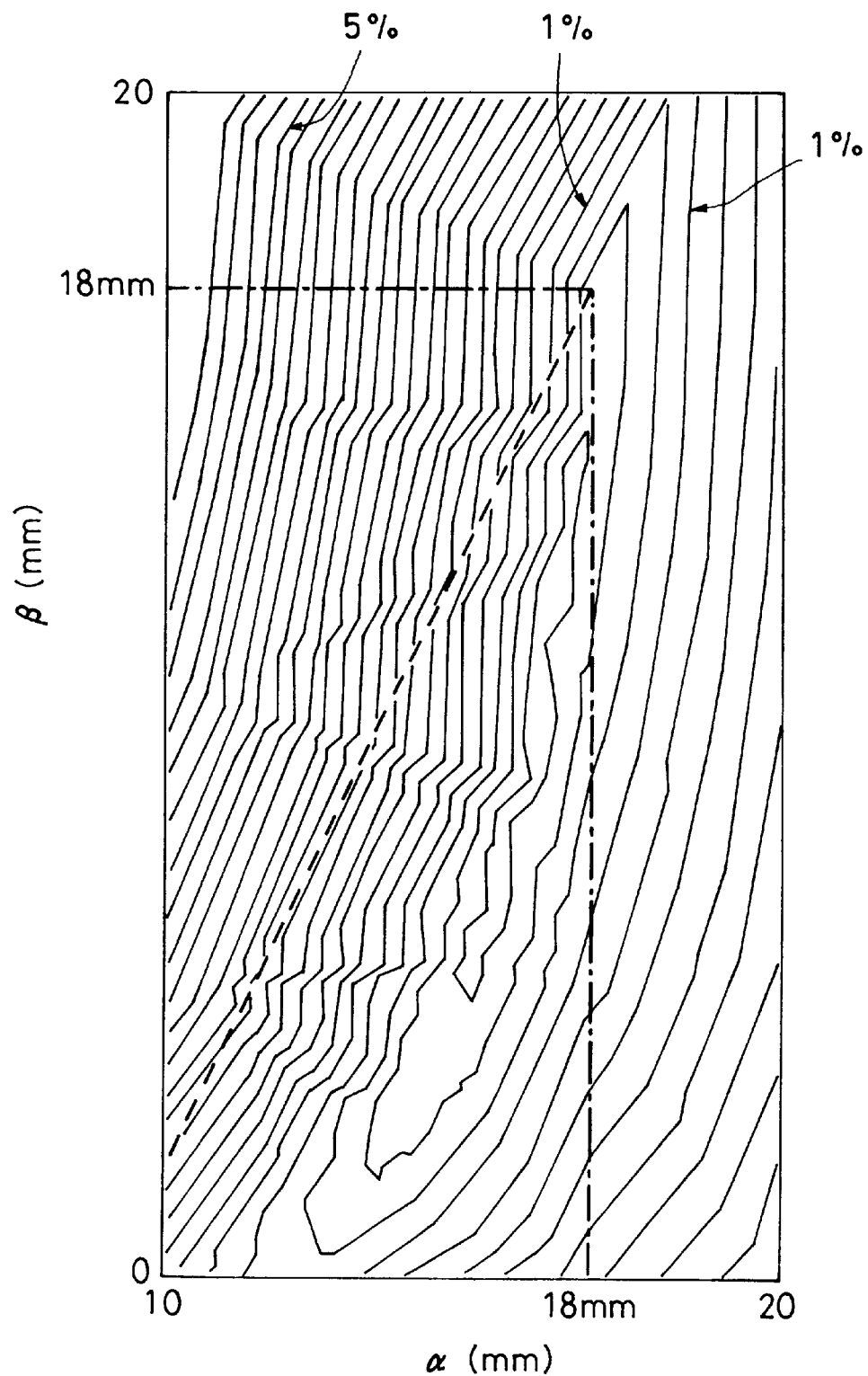
FIG. 5 is a relational diagram of the dimensions of a corrective magnet provided at the end portion and thrust ripples.

As shown in FIG. 5, changing the combination of α and β changes the value of the Fluctuation, and the value of Fluctuation can be reduced, i.e., thrust rippling can be reduced, by adjusting the length of magnet 13a or magnet 13b. For example, in order to keep the value of the Fluctuation within 1%, a combination of α and β within the 1% contour line in the figure can be used.

Particularly, in the event that the permanent magnets are to serve as the movable portion, the weight of the permanent magnets must be reduced as much as possible in order to increase thrust. By using FIG. 5, a value of the Fluctuation within a certain value can be realized, and a combination of α and β which minimizes the total length or total volume of the corrective magnets can be calculated.

Incidentally, it can be understood from FIG. 5 that the above optimal combination of α and β is included in a range in which the value of α and β is smaller than the length of the permanent magnets 11a and 11b (18 mm). Thus, thrust rippling can be reduced by making the length or volume of the corrective magnets provided to at least the end portion of the array to be the same as or smaller than the other permanent magnets. In FIG. 5, the inner side of two single-dot broken lines representing α=18 mm and β=18 mm indicates that area. Incidentally, more generally, the above effect can be generated by making α smaller than the length of a permanent magnet with the same magnetic polarity direction (e.g. 11a) and by making β smaller than the length of a permanent magnet with the same magnetic polarity direction (e.g. 11b), since the length of the permanent magnet 11a and the permanent magnet 11b may differ.

Also, it is preferable that the value of α be made to be greater than ½ of the length of the permanent magnet 11a. The this reason for this is that, as shown in FIG. 2, when the movable portion of the motor moves to its maximum extent, the right end of coils 16 are directly above position P, which is to the right of the right end of magnet 11b, and the corrective magnet must extend beyond position P, to the right thereof. Specifically, it is preferable that the value of a be greater than ½ of the length of the permanent magnet 11a, i.e., 9 mm.

Also, based on FIG. 5, since the optimal values for α and β are below the broken diagonal line joining the unshown point (α, β)=(9, 0) with the point (18, 18), a combination of α and β capable of reducing thrust rippling in a sure manner can be calculated by making the value of β smaller than a value twice the difference of the value of α and ½ the length of the permanent magnet 11a (i.e., 9 mm). Incidentally, more generally, making the value of α to be greater than ½ of the length of the permanent magnet 11a, and making the value of β to be smaller than a value obtained by multiplying [a value obtained by subtracting ½ of the length of the permanent magnet 11a from the value α] by [a value obtained by dividing the length of the permanent magnet 11b by ½ of the length of the permanent magnet 11a] can yield the same effects as above, since the length of the permanent magnet 11a and the length of the permanent magnet 11b are not the same.

Figure 6:
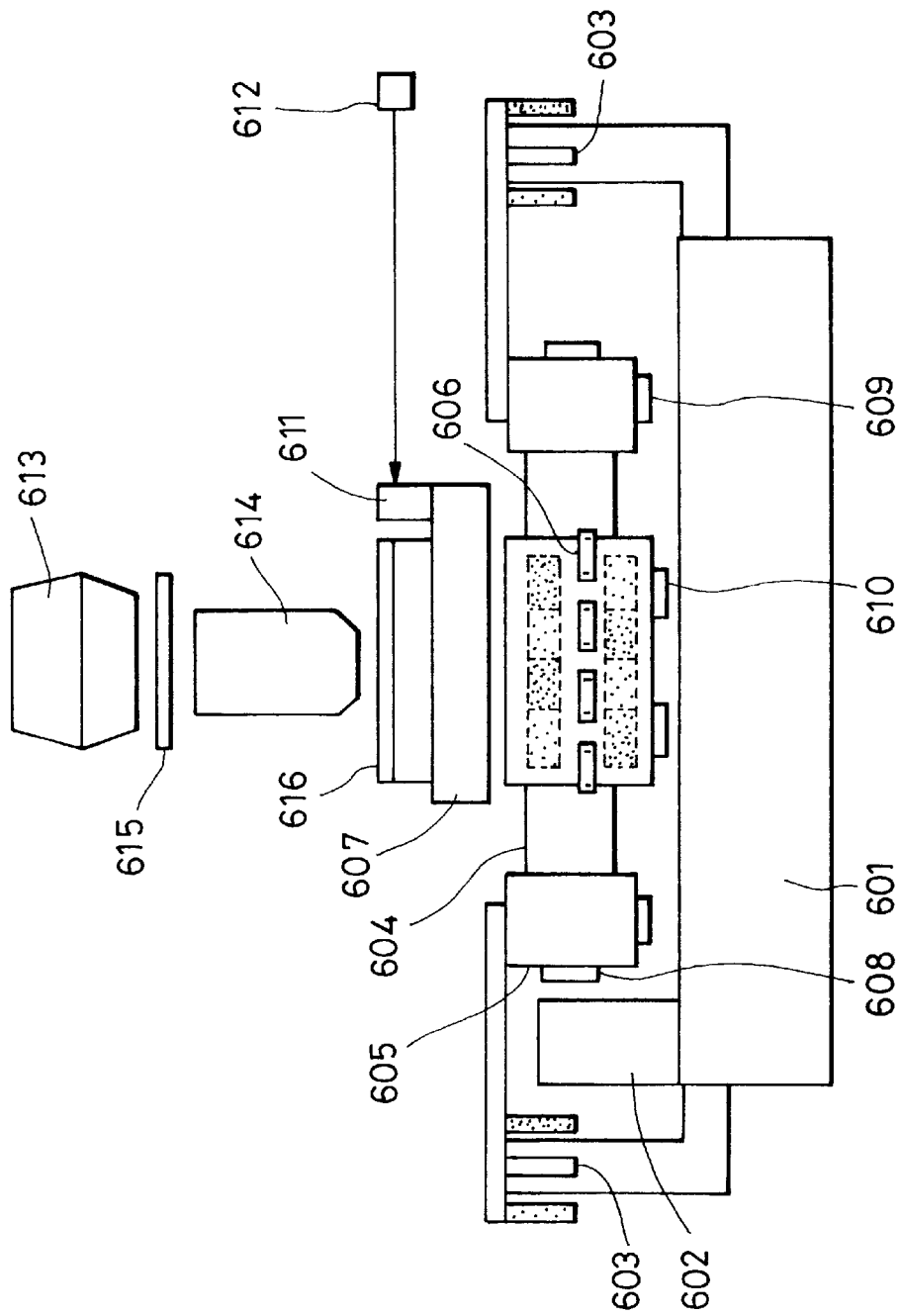
FIG. 6 is a schematic diagram of an exposure device having a stage device using the linear motor.

FIG. 6 shows the construction of an exposure device for manufacturing semiconductor devices, having a stage device using the above linear motor.

According to the construction shown in FIG. 6, a guide 602 and stator of a linear motor 603 are fixed on a base 601. Here, the linear motor 603 has the above-described construction, that is, the stator has multi-phase electromagnetic coils, and the movable portion has permanent magnets. The movable portion of the linear motor 603 is connected to a movable portion 605 and a movable guide 604, and the movable guide is moved in a direction normal to the plane of the figure by means of being driven by the linear motor 603. Also, the movable portion 605 is supported by a static bearing 609 with reference to the upper surface of the base 601, and a static bearing 608 with reference to the side surface of the guide 602.

Next, a description will be provided regarding the moving stage 607. The moving stage 607 which has been positioned so as to straddle the movable guide 604 is supported by a static bearing 610. This moving stage 607 moves in the right and left directions by means of being driven by a linear motor 606 having the above construction, with reference to the movable guide 604. The movement of the stage 607 is measured by a mirror 611 and laser interferometer 612 fixed on the stage 607. A wafer 616 is held by a chuck mounted on the stage 607, and a circuit pattern on a rectile 615 is reduced and transferred onto the wafer 616 by means of a light source 613 and a projecting optical system 614, in order to perform exposure and transfer of a circuit pattern onto this wafer 616.

According to the present embodiment, using the linear motor with excellent properties as described above realizes an excellent stage device and exposing device.

Next, a description will be provided regarding an example of the manufacturing of a device using this exposure device.

Figure 7:
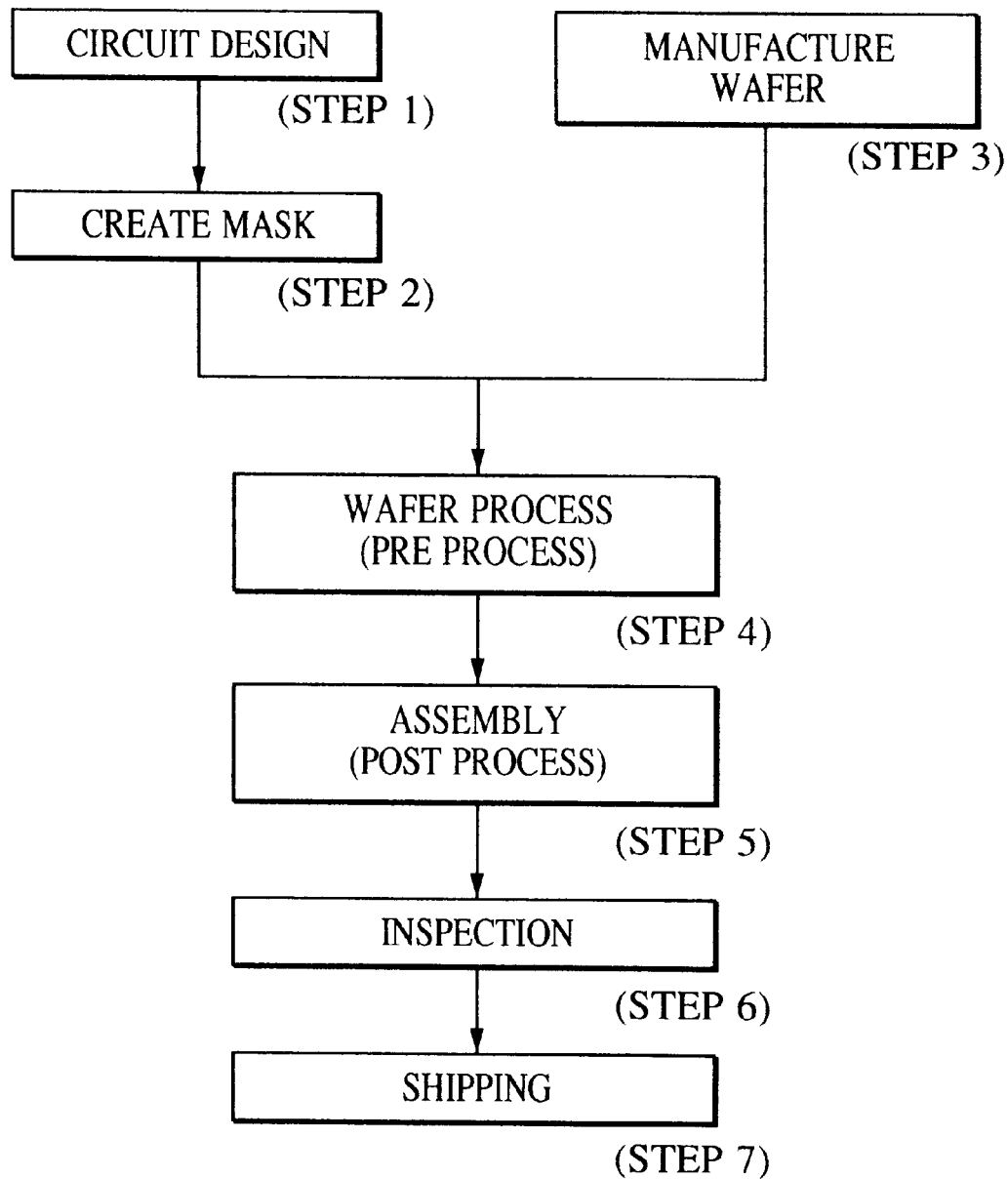
FIG. 7 is a flowchart illustrating the manufacturing process of minute devices.

FIG. 7 shows a flowchart for manufacturing a minute device (semiconductor chips such as ICs or LSIs, liquid crystal panels, CCDs, thin-film magnetic heads, micromachines, etc.). In Step 1 (circuit design), circuit design of the semiconductor device is performed. In step 2 (creating a mask), a mask is manufactured, with the form of the designed pattern. In the other hand, in Step 3 (creating the wafer), the wafer is manufactured using materials such as silicon or glass. In step 4 (wafer processing), which is a pre-process, the mask and wafer prepared above are used, and the actual circuit is formed on the wafer using lithography technology. The following step 5 (assembly) which is a post-process is a process for making a semiconductor chip of the wafer manufactured in Step 4, and includes steps such as assembly (dicing, bonding) and packaging (sealing the chip). Step 6 (inspection) is a process for performing operation testing of the semiconductor device, endurance testing, and so forth. The semiconductor device is thus completed by these steps, and is hence shipped (Step 7).

Figure 8:
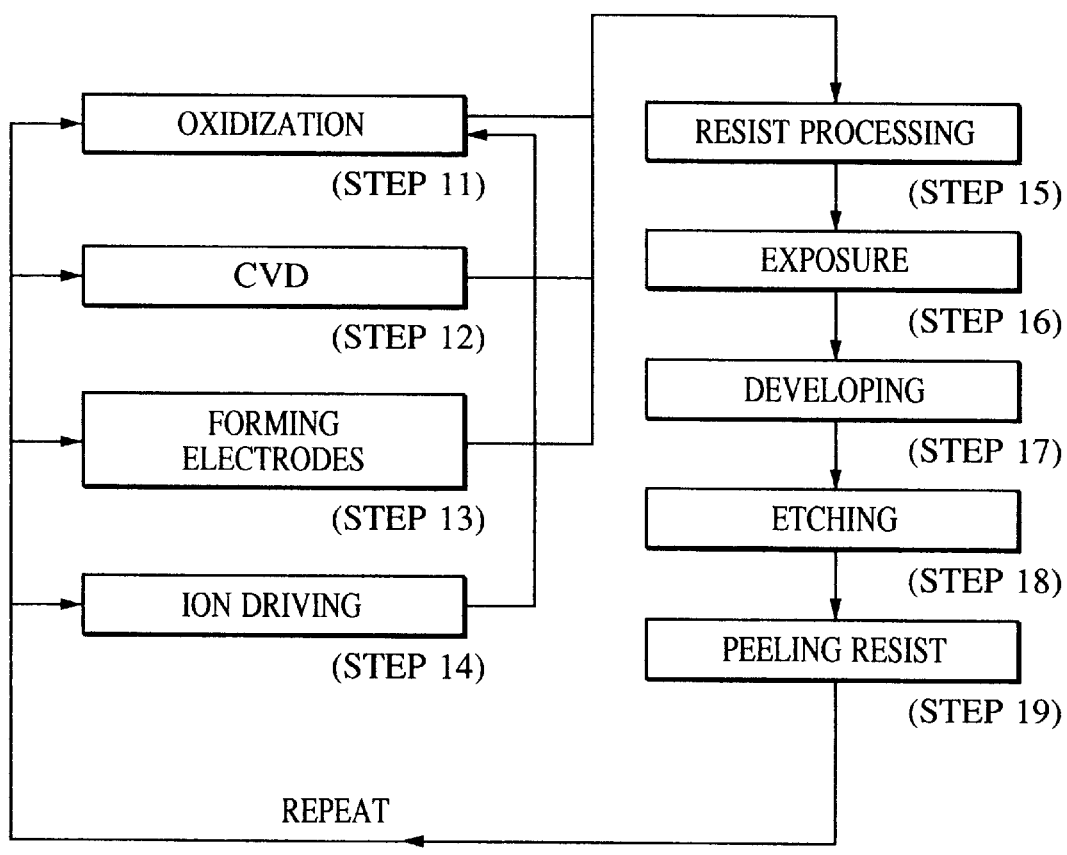
FIG. 8 is a detailed flowchart of the wafer process shown in FIG. 8.
Figure 9:
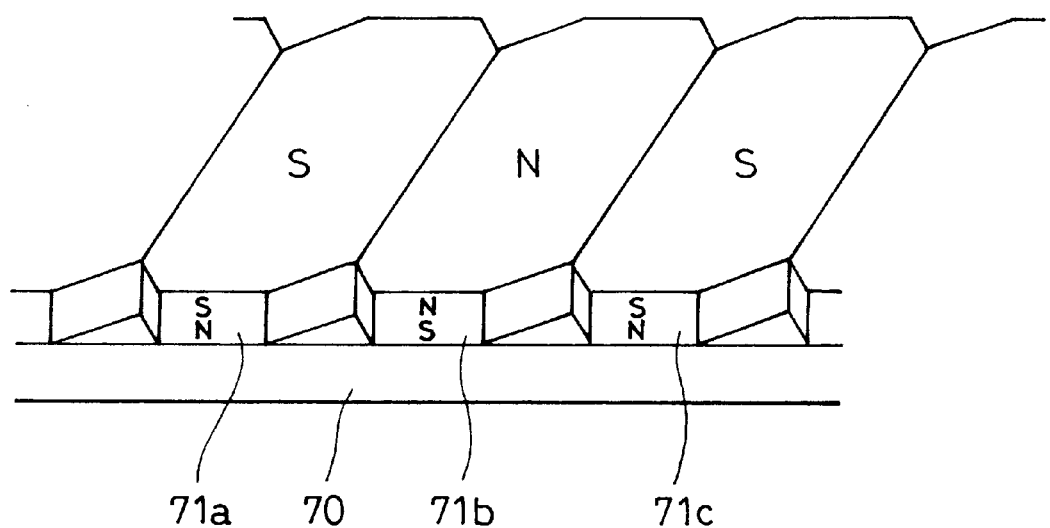
FIG. 9 is a schematic diagram illustrating a known linear motor.

FIG. 8 is a detailed flowchart of the above wafer processing. Step 11 (oxidizing) is a step for oxidizing the surface of the wafer. In Step 12 (CVD), an insulating film is formed on the surface of the wafer. In Step 13 (forming electrodes), electrodes are formed on the wafer by vapor deposition. In Step 14 (ion driving), ions are driven into the wafer. In Step 15 (resist processing), photo-sensitive material is applied to the wafer. In Step 16 (exposure), the circuit pattern on the mask is burnt onto the wafer by means of an exposure device having means for confirming the above-described exposure. In Step 17 (developing), the exposed wafer is developed. In Step 18 (etching), portions other than the developed resist are etched away. In Step 19 (peeling the resist), the resist which has become unnecessary because of completion of the etching is removed. Repeating the steps 11 through 19 forms a plurality of layers of circuit patterns on the wafer.

According to the present embodiment, in each of the repeated processes, using the stage device with excellent positioning precision in stage driving for the above-described exposure (Step 16) realizes the manufacturing of highly-integrated devices at a low cost, which has been difficult until now.

As described above, according to the present invention, the magnetic field can be made to approximate a sine-waveform as far as the end portion of the permanent magnets, and a linear motor device can be provided with little thrust rippling along a long stroke. Particularly, according to the present embodiment, a stage device with high positioning precision can be provided by this linear motor. Further, according to the present invention, an exposing device capable of high-precision exposure can be provided.

What is claimed is:

1. A linear motor comprising:

a coil for receiving an electrical current; and a first plurality of permanent magnets, wherein said coil and said first plurality of permanent magnets move relative to each other in a direction of relative movement when an electrical current flows through said coil, wherein said permanent magnets are arrayed in the direction of relative movement to form a first array, wherein the direction of polarity of each permanent magnet in said first plurality of permanent magnets is oriented 90° relative to the direction of polarity of an adjacent permanent magnet in said first plurality of permanent magnets, wherein said first plurality of permanent magnets has a main portion and an end portion comprising plural corrective permanent magnets, and wherein each of said plural corrective permanent magnets is smaller than any one of the permanent magnets in said main portion having the same or opposite direction of polarity.

2. A linear motor according to claim 1, wherein the number of said plural corrective permanent magnets is two.

3. A linear motor according to claim 2, wherein said plural corrective permanent magnets comprise an end corrective permanent magnet positioned at the end of the end portion of said first plurality of permanent magnets whose dimension in the direction of relative movement is denoted by $L_{ec}$, and a center side corrective permanent magnet positioned adjacent to said end corrective permanent magnet, being closer to the center of said first plurality of permanent magnets than said end corrective permanent magnet and whose dimension in the direction of relative movement is denoted by $L_{cc}$, wherein said main portion of said first plurality of permanent magnets comprises first and second main permanent magnets, wherein said first main permanent magnet has the same polarity direction as the end corrective permanent magnet and its dimension in the direction of relative movement is denoted by $L_{main\text{-}same\text{-}polarity\text{-}as\text{-}ec}$, and wherein said second main permanent magnet has the same polarity direction as said center side corrective permanent magnet and its dimension in the direction of relative movement is denoted by $L_{main\text{-}same\text{-}polarity\text{-}as\text{-}cc}$, wherein said motor satisfies the following inequalities:

$$L_{main\text{-}same\text{-}polarity\text{-}as\text{-}cc}/2 < L_{cc} < L_{main\text{-}same\text{-}polarity\text{-}as\text{-}cc};$$

$$L_{ec} < (L_{cc} - L_{main\text{-}same\text{-}polarity\text{-}as\text{-}cc}/2) \times L_{main\text{-}same\text{-}polarity\text{-}as\text{-}ec}/(L_{main\text{-}same\text{-}polarity\text{-}as\text{-}cc}/2).$$

4. A linear motor according to claim 2, wherein the direction of polarity of said end corrective permanent magnet is perpendicular to the direction of relative movement, and the direction of polarity of said center side corrective permanent magnet is parallel to the direction of relative movement.

5. A linear motor according to claim 2, comprising a second plurality of permanent magnets arrayed in the direction of relative movement to form a second array, wherein each permanent magnet in the first array is opposed to a corresponding permanent magnet in the second array, wherein corresponding, opposed permanent magnets in said first and second arrays have parallel directions of polarity, wherein the polarity direction changes by ninety degrees in a first rotation direction from one magnet to an adjacent magnet in the first array, wherein the polarity direction changes by ninety degrees in a second rotation direction, opposite from the first rotation direction, from one magnet to an adjacent magnet in the second array.

6. A linear motor according to claim 5, wherein said first and second arrays each comprise parallel permanent magnets whose polarity direction is parallel to the direction of relative movement and perpendicular permanent magnets whose polarity direction is perpendicular to the direction of relative movement, wherein the polarity direction of the parallel permanent magnets in the first array is in the opposite direction from opposed, corresponding parallel permanent magnets in said second array, wherein the polarity direction of said perpendicular permanent magnets in said first array is in the same direction as opposed, corresponding parallel permanent magnets in said second array.

7. A linear motor according to claim 1, wherein said permanent magnets comprise a movable portion of said motor and said coil comprises a stator of said motor.

8. A linear motor according to claim 1, wherein said first plurality of permanent magnets comprises a parallel main portion permanent magnet in said main portion whose polarity direction is parallel to the direction of relative movement and a parallel end portion permanent magnet in said end portion whose polarity is parallel to the direction of relative movement, wherein the right end of said coil, when said coil and said first plurality of permanent magnets move relative to each other to a maximum extent, is positioned, in the direction of relative movement, one-half the length of said parallel main portion permanent magnet from the end of said parallel end portion permanent magnet facing said main portion toward the right end of said end portion.

9. A stage device, comprising:

a stage; and a linear motor for moving the stage comprising:
a coil for receiving an electrical current; and
a first plurality of permanent magnets,
wherein said coil and said first plurality of permanent magnets move relative to each other in a direction of relative movement when an electrical current flows through said coil,
wherein said permanent magnets are arrayed in the direction of relative movement to form an array,
wherein the direction of polarity of each permanent magnet in the plurality of permanent magnets is oriented 90° relative to the direction of polarity of an adjacent permanent magnet in said first plurality of permanent magnets,
wherein said first plurality of permanent magnets has a main portion and an end portion comprising plural corrective permanent magnets, and
wherein each of said plural corrective permanent magnets is smaller than any one of the permanent magnets in said main portion having the same or opposite direction of polarity.

10. An exposing device for transferring a pattern formed on a reticle onto a wafer, comprising:

a stage for loading a wafer or reticle having a pattern formed thereon;

a linear motor for moving said stage comprising:
a coil for receiving an electrical current; and
a plurality of permanent magnets,
wherein said coil and said plurality of permanent magnets move relative to each other in a direction of relative movement when an electrical current flows through said coil,
wherein said permanent magnets are arrayed in the direction of relative movement to form an array,
wherein the direction of polarity of each permanent magnet in said plurality of permanent magnets is oriented 90° relative to the direction of polarity of an adjacent permanent magnet in said plurality of permanent magnets,
wherein said plurality of permanent magnets has a main portion and an end portion comprising plural corrective permanent magnets, and
wherein each of said plural corrective permanent magnets is smaller than any one of the permanent magnets in said main portion having the same or opposite direction of polarity; and means for transferring the pattern formed on the reticle onto the wafer.

* * * * *

UNITED STATES PATENT AND TRADEMARK OFFICE
CERTIFICATE OF CORRECTION

PATENT NO. : 6,043,572

DATED : March 28, 2000

INVENTOR(S) : Shingo NAGAI, et al.

Page 1 of 2

It is certified that error appears in the above-identified patent and that said Letters Patent is hereby corrected as shown below:

IN THE DRAWINGS:

Sheet 2, in Figure 3, "MAGETIC" should read --MAGNETIC--.
Sheet 6, Figure 7, "(PRE PROCESS)" should read --PRE-PROCESS-- and (POST PROCESS)" should read --POST-PROCESS--.

COLUMN 3:

Line 41, "diovention" should read --invention--.

COLUMN 4:

Line 30, "adjascent" should read --adjacent--.

COLUMN 5:

Line 52, "than" should read --the--.

COLUMN 7:

Line 14, "The" should read --the--.
Line 38, "to" should read --to the--.
Line 64, "be" (second occurrence) should be deleted.

UNITED STATES PATENT AND TRADEMARK OFFICE
CERTIFICATE OF CORRECTION

PATENT NO. : 6,043,572
DATED : March 28, 2000
INVENTOR(S) : Shingo NAGAI, et al.

It is certified that error appears in the above-identified patent and that said Letters Patent is hereby corrected as shown below:

COLUMN 8:

Line 38, "as" (first occurrence) should read --are--.
Line 42, "a" should read --∝--.
Line 67, "a" should read --∝--.

COLUMN 9:

Line 8, "this" (first occurrence) should be deleted.
Line 13, "a" should read --∝--.

Signed and Sealed this

Twenty-fourth Day of April, 2001

Attest:

NICHOLAS P. GODICI

*Attesting Officer*   *Acting Director of the United States Patent and Trademark Office*